(12) United States Patent
Seth et al.

(10) Patent No.: US 8,704,550 B2
(45) Date of Patent: Apr. 22, 2014

(54) ARCHITECTURE FOR VBUS PULSING IN UDSM PROCESSES

(75) Inventors: Sumantra Seth, Karnataka (IN); Somasunder Kattepura Sreenath, Karnataka (IN); Sujoy Chakravarty, Karnataka (IN); Abhijith Arakali, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/946,876

(22) Filed: Nov. 29, 2007

(65) Prior Publication Data

US 2009/0140772 A1      Jun. 4, 2009

(51) Int. Cl.
*H03K 19/094*      (2006.01)

(52) U.S. Cl.
USPC ............................................. 326/83; 326/87

(58) Field of Classification Search
USPC ................................ 326/82–87; 327/108, 109
See application file for complete search history.

(56) References Cited

U.S. PATENT DOCUMENTS 5,168,176 A * 12/1992 Wanlass ........................... 326/87
5,959,473 A *  9/1999 Sakuragi ........................ 327/111

OTHER PUBLICATIONS

On-The-Go supplement to USB 2.0 Specification, Revision 1.0a, Jun. 24, 2003.
Universal Serial Bus Specification, Revision 2.0, Apr. 27, 2000.

* cited by examiner

*Primary Examiner* — Thienvu Tran
(74) *Attorney, Agent, or Firm* — Ronald O. Neerings; Wade James Brady; Frederick J. Telecky, Jr.

(57) ABSTRACT

Architecture for VBUS pulsing in an Ultra Deep Sub Micron (UDSM) process for ensuring USB-OTG (On The Go) session request protocol, the architecture being of the type wherein at least a charging circuit is deployed, uses a diode-means connected in a forward path of the charging circuit. The architecture might include a diode-divider including nodes and connected from VBUS in said charging circuit. One embodiment uses both charging and discharging circuits comprising transistors. The charging circuit transistor might comprise a PMOS transistor and the discharging circuit transistor might comprise a NMOS transistor. The architecture might include a three resistance string of a total resistance value approximating 100K Ohms connected between said VBUS and ground, wherein the discharging circuit transistor might comprise a drain extended NMOS transistor. The charging and discharging circuit transistors have VDS and VGD of about 3.6V, whereby high VGS transistors are not needed.

14 Claims, 5 Drawing Sheets

US 8,704,550 B2

ARCHITECTURE FOR VBUS PULSING IN UDSM PROCESSES

FIELD OF THE INVENTION

The present invention generally relates to VBUS pulsing architecture in USB OTG applications, and more particularly to VBUS puling architecture in USB OTG applications in UDSM (ultra-deep sub-micron) technology for supporting session request protocol.

BACKGROUND OF THE INVENTION

A brief discussion of the USB-OTG (Universal Serial Bus-On The Go) is deemed to be conducive to a proper understanding of the present invention. The USB-OTG allows USB device-to-device communications without the intervention or use of a computer. The session request protocol (SRP) is used to establish this logical connection, and the implementation of SRP may be associated with software real time requirements that may be difficult to achieve in some systems.

The USB is associated with an industry standard originally designed for personal computers as a low cost device for adding peripherals. The USB standard defines a host/peripheral relationship: the PC is the host, and devices that plug into it are known as peripherals. The USB has become indispensable because of its increasing use in devices such as mobile telephones, battery-operated devices such as PDAs, cellular phones and digital cameras, frequently leaving the PC out of the picture. Users may need to connect these battery-operated devices directly to each other, a use not supported by USB per se. To address this limitation, a supplement to the USB 2.0 specification, called USB On-The-Go (OTG) supplement was provided to enable mobile interconnectivity by defining how two devices may connect without the need for a computer host. Under USB OTG, a user plugs two devices together to establish a link. The devices take care of all the host/peripheral negotiations without any input from the user, to make the connectivity simple. Further, USB OTG defines two types of configurations: A-devices (devices that have a Standard-A or Mini-A plug inserted), are hosts by default when connected, and B-devices (devices that have a Standard-B or Mini-B plug inserted), are peripherals by default when connected. OTG-devices (formerly known as dual-role-devices) can be either an A-device or B-device, giving it the potential to be either host or peripheral. The status is negotiated between the devices.

There is need to cater for situations where user-devices need to be interconnected to communicate directly with each other without the use of a computer. For example, a USB color printer may need to be connected to a cellular camera phone to print some pictures, or a USB hard disk could be connected to a PDA to transfer several files. The USB OTG supplement was added to the USB 2.0 specification for this type of applications. This addendum supplement defines a protocol for OTG devices to establish communication and designate host and device roles during a session.

Some USB-OTG devices use a mini-AB receptacle, which can accept both mini-A USB plug or mini-B USB plugs. The USB-OTG uses the SRP to establish a session (connection) between two USB devices. In addition to providing new device definitions, USB OTG presents many challenges for portable electronic system engineers. USB OTG defines low power consumption for portable devices. When there is no active session, VBUS is turned off to save battery power. If the A-device turns off the VBUS, but the B-device wants to use the bus, the B-device can request that the A-device turn on VBUS. This request is identified as Session Request Protocol (SRP) by the USB OTG supplement and it is performed by data-line pulsing and VBUS pulsing.

In a "classic" USB system, the host provides power at a nominal 5V and at least 100 mA on the USB VBUS line at all times when the host is operational. This is acceptable when the host is attached to a line power source, but could be a crippling drain on a tiny device like a cellular phone. To conserve power and extend battery life, the On-The-Go supplement provides a means for an OTG host (the "A-device") to turn off the VBUS when there is no activity on the bus. The Session Request Protocol (SRP) is a means for the peripheral device (the "B-device") to request that the A-device re-enable VBUS and start a session. The B-device can initiate the SRP any time when at least 2 ms have elapsed since the end of the previous session. To initiate SRP, the B-device performs both "data-line pulsing" and "VBUS pulsing". It does data-line pulsing by enabling its data line pull-up resistor (on D+ for full-speed devices, D− for low-speed devices) for between 5 ms and 10 ms. VBUS pulsing is performed by driving the VBUS to an intermediate voltage. The A-device detects either the data-line pulsing or VBUS pulsing and initiates a session by enabling the VBUS. The session lasts until the A-device decides that there is no more traffic that needs to occur on the bus, at which time it terminates the session by turning off the VBUS.

The OTG supplement of USB2.0 provides the framework necessary for operating dual-role OTG devices. In order to accomplish this functionality, a device needs to support the SRP and Host Negotiation Protocol (HNP). The SRP is used by the B-Device (the peripheral device, refer to FIG. 1) to request for a session and the HNP is used to override the default Host/Device functionality of the dual-role devices. The VBUS pin is used only as a supply pin in USB1.0 where the standard host supplies power to the peripheral devices through this pin. But in USB2.0, VBUS pin is a supply pin when a B device is connected to a standard host while it is used for SRP when two OTG compliant devices are connected. As aforesaid, SRP can be achieved using two methods, data-line pulsing and VBUS Pulsing, and the B-device needs to use both the methods to insure that the dual role A-device (the host) responds to SRP.

DESCRIPTION OF THE INVENTION

The present invention provides architecture for VBUS pulsing in an UDSM process for enabling USB OTG session request protocol wherein at least a charging circuit is used. In one embodiment, a charging and discharging circuit are both deployed, and the architecture includes a diode means connected in the forward path of the charging circuit. The architecture might also include a diode-divider string including nodes and connected from the VBUS in the charging circuit.

The invention in one form resides in architecture for VBUS pulsing in an UDSM (Ultra Deep Sub Micron) process for enabling USB-OTG (On The Go) session request protocol, the architecture being of the type where a back-gate switching circuit which includes charging and discharging transistors is used, the architecture comprising a diode-means connected in a forward path of the charging transistor. For example, the diode means might comprise a PN diode which is selected to have a desired on-resistance and, the charging and discharging transistors might comprise MOS transistors.

In a second form, the invention resides in an architecture for VBUS pulsing in an UDSM process for USB-OTG session request protocol where charging and discharging transistors are deployed, comprising a diode-means connected in a forward path of the charging transistor, where the charging and discharging transistors each comprise a drain extended MOS switch.

In a modification, the invention resides in an architecture for V-BUS pulsing in an Ultra Deep Sub Micron (UDSM) process for ensuring USB-OTG (On The Go) session request protocol, the architecture being of the type wherein at least a charging circuit is used, the architecture comprising a diode-means connected in a forward path of the charging circuit, the architecture including a diode-divider including nodes and connected from V-BUS in the charging circuit.

Details of exemplary values for the resistance, capacitance and other parameters, as well as other possible modifications are described hereinafter and are recited also in the claims.

BRIEF DESCRIPTION OF THE DRAWING

A more detailed understanding of the invention may be had from the following description of embodiments, given by way of example and to be understood in conjunction with the accompanying drawing wherein.

DETAILED DESCRIPTION

A detailed description of one or more embodiments of the invention is provided below in the context of the accompanying FIGs that illustrate by way of example the principles of the invention. While the invention is described in connection with such embodiments, it should be understood that the invention is not limited to any embodiment. On the contrary, the scope of the invention is limited only by the appended claims and equivalents, and the invention encompasses numerous alternatives and modifications. For purposes of example, numerous specific details are set forth in the following description in order to provide a thorough understanding of the present invention.

The present invention may be practiced according to the claims without some or all of these specific details. For the purpose of clarity, technical material that is known in the technical fields related to the invention has not been described in detail so that the present invention is not unnecessarily obscured.

Figure 1:
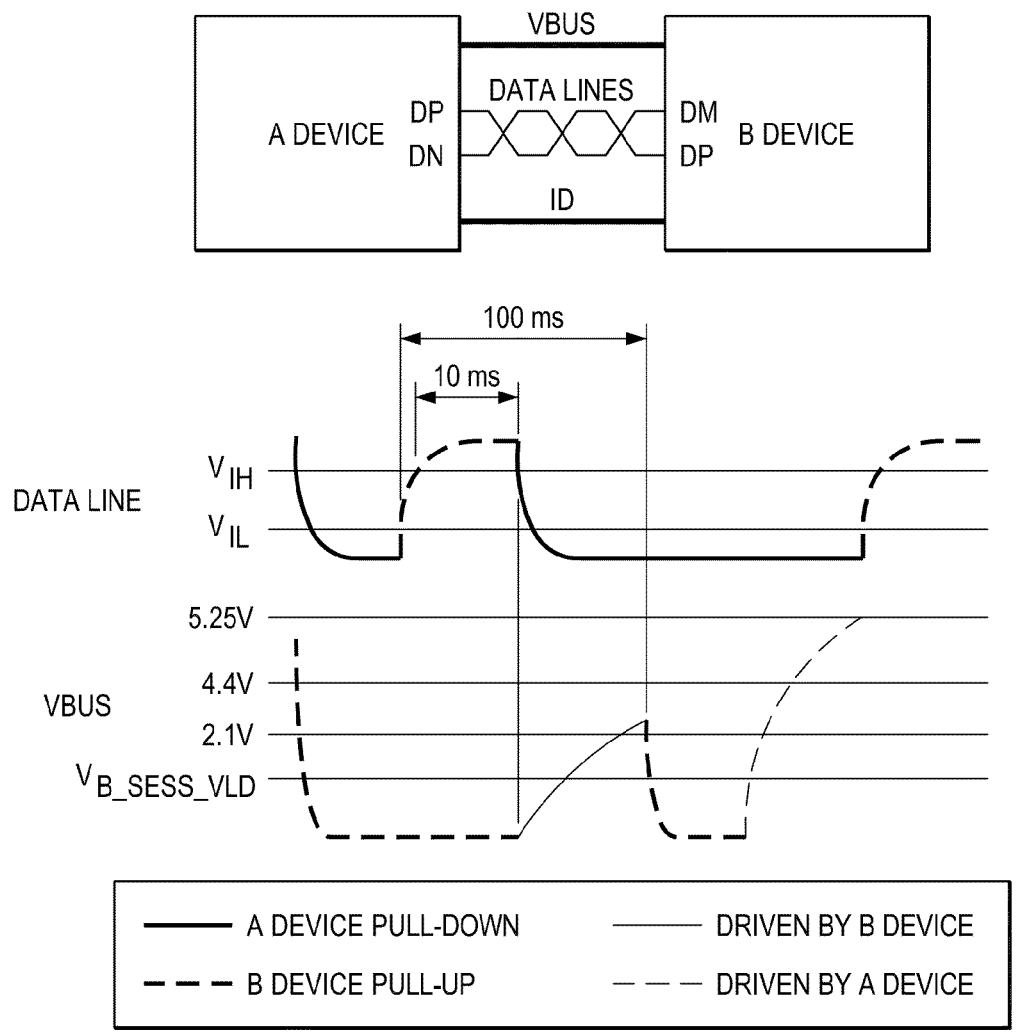
FIG. 1 illustrates a schematic showing VBUS pulsing.

In the VBUS Pulsing method, a session is requested by the B-device by charging the VBUS to a minimum voltage of 2.1V if connected to a dual role A-device (refer to FIG. 1). If it is connected to a standard host, VBUS should not be driven above 2.0V. This can be achieved because of the difference in capacitance of standard host (96 uF) and a dual-role device (6.5 uF). The maximum resistance from VBUS to ground is 100 K Ohm when the A device is not feeding the VBUS.

The circuit needs to meet the following requirements/specifications,

1. It has to withstand 5.25V on VBUS (this condition can happen when the block is powered down or when a session is active for a B-device).
2. It should be able to charge VBUS to a minimum voltage of 2.1V when the VBUS is not fed by the A device but the B device requests for a session. This is similar to wake-up protocols in I/Os. The VBUS needs to be charged to 2.1V within 90 ms which is the B-device SRP initiation time. The minimum output resistance of the charging circuitry must be 281 Ohms.
3. It may support discharging of VBUS using a pull-down resistance. This is not necessary because the 100 K Ohms pull-down present on VBUS can discharge VBUS in the available time. The addition of this feature can help make discharge faster but is not absolutely essential in the protocol. The maximum current allowed to be drawn by the pull-down resistor is 8 mA and hence, the minimum value of the pull-down resistor is 656 Ohms.

Figure 2:
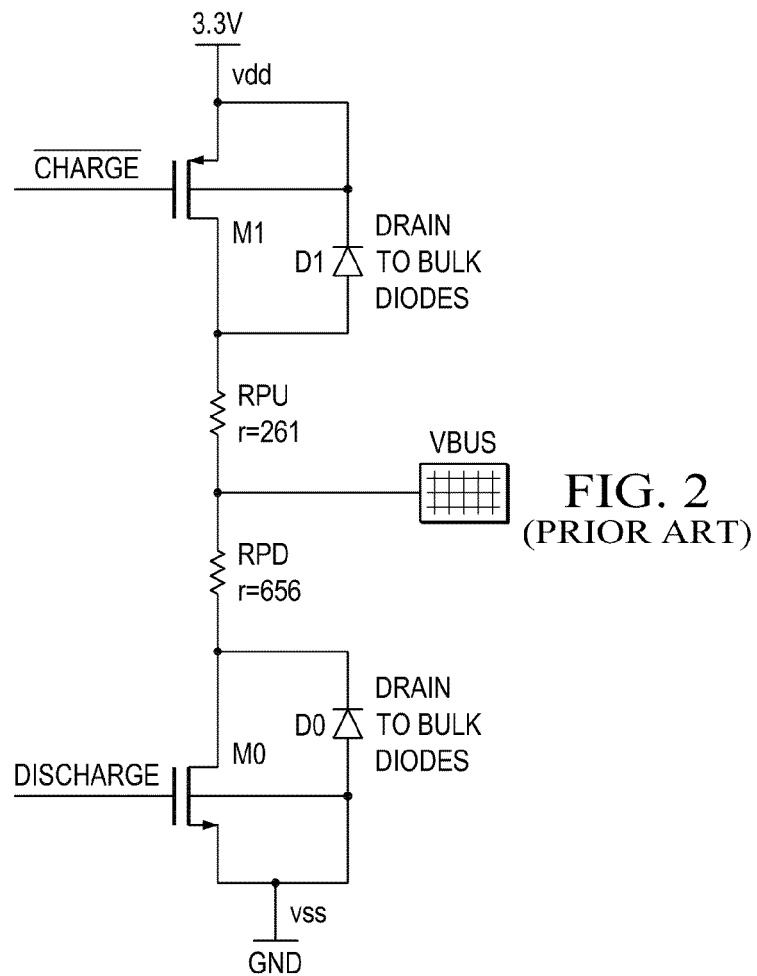
FIG. 2 illustrates a prior art charge-discharge circuit which is relevant in the context of the present invention.

The simplest design for one form of VBUS pulsing architecture is to have one switch from VBUS to 3.3V supply through a pull up resistor (RPU) for charging and another switch from VBUS to ground through a pull-down resistor (RPD) for discharging as shown in FIG. 2. This can take care of requirements/specifications 2 and 3. In requirement 1 supra, when the voltage on VBUS is 5.25V, the drain to bulk diode of the PMOS switch turns on drawing large current. This causes two problems, first being the current drawn from VBUS, and second the 3.3V supply may get charged to a higher voltage causing reliability concerns in other circuits sharing the supply. As a result this scheme illustrated in FIG. 2 is not always acceptable.

Figure 3:
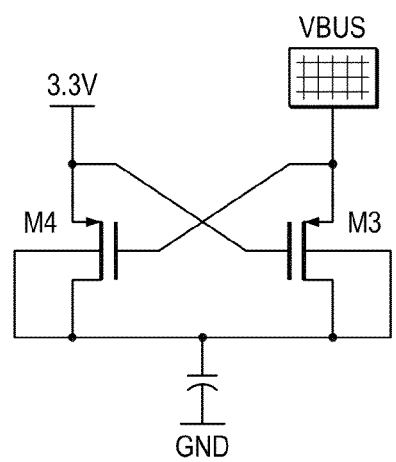
FIG. 3 illustrates a back-gate switching circuit which is relevant in the context of the present architecture.

The conventional solution to the above problem is to switch the back gate and the gate of the PMOS to the higher of the two voltages VBUS or the 3.3V supply as shown in FIG. 3. This scheme is possible in processes having high-voltage tolerant transistors. The transistor M3 needs to withstand a VGS of 5.25V when the 3.3V supply is missing.

As one migrates towards the Ultra-deep sub-micron (UDSM) processes, it becomes increasingly difficult and complicated to ensure reliability in legacy high-voltage modes of operation. Special circuit techniques are necessary to ensure reliability in such modes.

The transistors available for design in UDSM processes are the core transistors (1.2V) and the I/O transistors (1.8V), thereby limiting the VGS range for reliable operation. In addition, drain-extended transistors that can withstand higher voltage across drain-source and gate-drain terminals may be available. But, the VGS range is still limited to 1.8V. As a result, a back gate switching circuit is very difficult to be implemented in UDSM processes due to reliability concerns. This calls for novel architectures to implement reliable VBUS-Pulsing SRP in UDSM processes. Described hereinafter are at least two architectures for implementing VBUS-Pulsing in which, high VGS transistors are not used. The I/O transistors with maximum VDS and VGD of 3.6V have been used to implement the proposed architectures. Depending on the system requirements, one of the schemes can be chosen.

In the implementation shown in FIG. 2, the reverse current, when the VBUS is at 5.25V, will be very high as the diode D1 will turn on and charge the supply. Hence that architecture can be improved by increasing the resistance of the series resistor RPU to restrict the current drawn from VBUS. To limit the current drawn from VBUS to 100 uA, the resistance needed would be (5.25-3.3-1 Diode drop)/100e-6. Typical forward diode drop in this process is about 800 mV which means that the resistance required is about 12 k. With 13 uF load capacitance on VBUS and neglecting load resistance, the time constant is 156 ms. If the charging time needs to be restricted to 90 ms, the required time constant should be of the order of few milliseconds. This architecture also suffers from the drawback that if the 3.3V supply is missing and is floating, then VBUS could charge the supply to a voltage higher than 3.6V causing reliability problems for other circuits.

Figure 4:
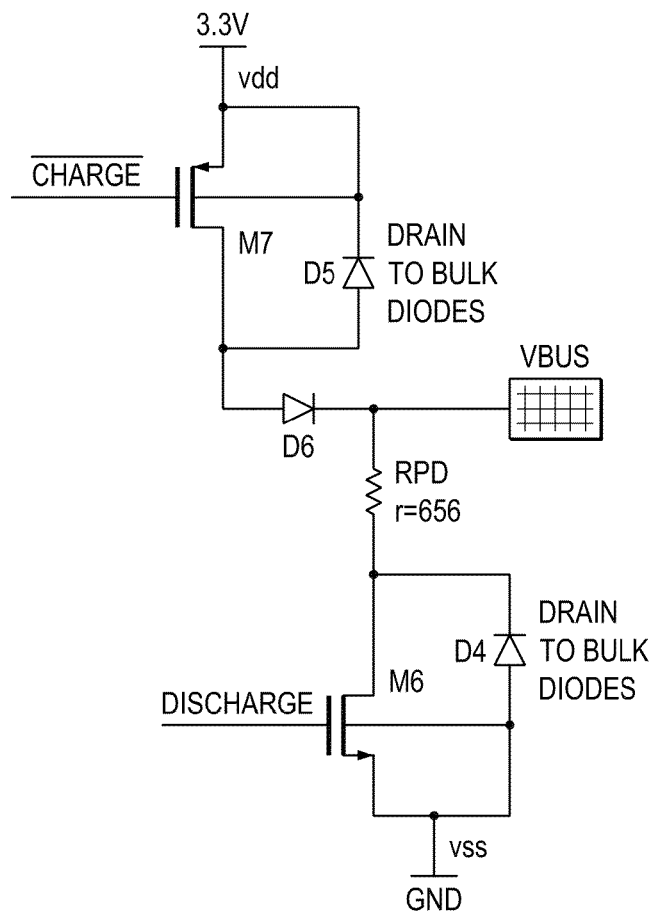
FIG. 4 illustrates one exemplary embodiment using the charge-discharge circuit.

To improve the charging time and reduce the reverse current, a diode D6 can be used in the forward path of the charging transistor as shown in FIG. 4. In this solution, the positive (henceforth referred to as P) terminal of the PN diode D6 is not defined when VBUS is at 5.25V and the NMOS discharge transistor gets stressed when VBUS is at 5.25V. The next logical step in arriving at the solution is to have a circuit whose block diagram is as shown in FIG. 5.

Figure 5:
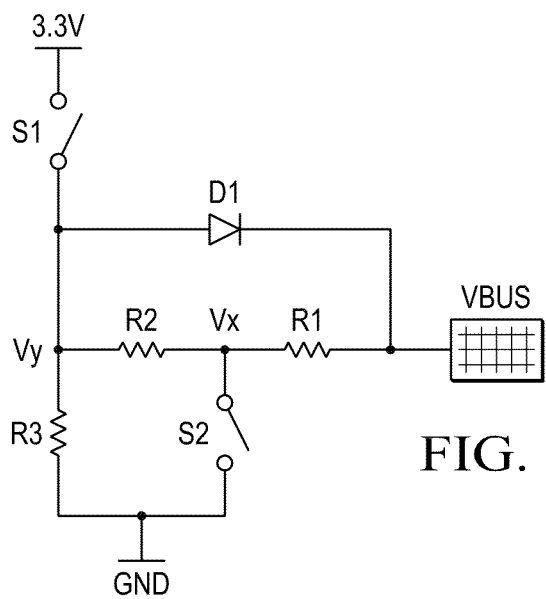
FIG. 5 illustrates the details of a proposed charge-discharge circuit used in one embodiment.

In the illustration of FIG. 5, the charging time will be decided by the on-resistance of the diode D1 and the load capacitance while discharge time will be decided by the resistance R1 and the load capacitance. The ratio between the resistors can be so adjusted that all the switches face no stress and the absolute values of the resistors can be chosen in such a manner that the maximum value of current drawn from VBUS is less than 100 uA.

In actual design in the context of FIG. 5, the on-resistance of the diode was about 300 Ohms which gives a time constant of 4 ms with a load capacitance of 13 uF. The resistance split R1, R2 and R3 is used to optimize the discharge time, for ensuring the reliability of S1, S2 and to avoid charging up the supply beyond the operating range. If R1+R2+R3 is kept at 100 K Ohms, current drawn from VBUS when it is at 5.25V would be 52.5 uA. To ensure reliability of S2, Vx needs to be less than 3.6V. To avoid charging up the supply beyond the operating range, Vy needs to be less than 3V. With R1=35K, R2=15K and R3=50K, the NMOS switch will have a drain to source voltage of 3.4V which a 1.8V drain extended NMOS transistor can handle while the P terminal of the diode D1 will be at 2.625V and hence, well defined. In this design, there won't be any current into the 3.3V supply as the P terminal of diode D1 is restricted to less than 2.625V.

Figure 6:
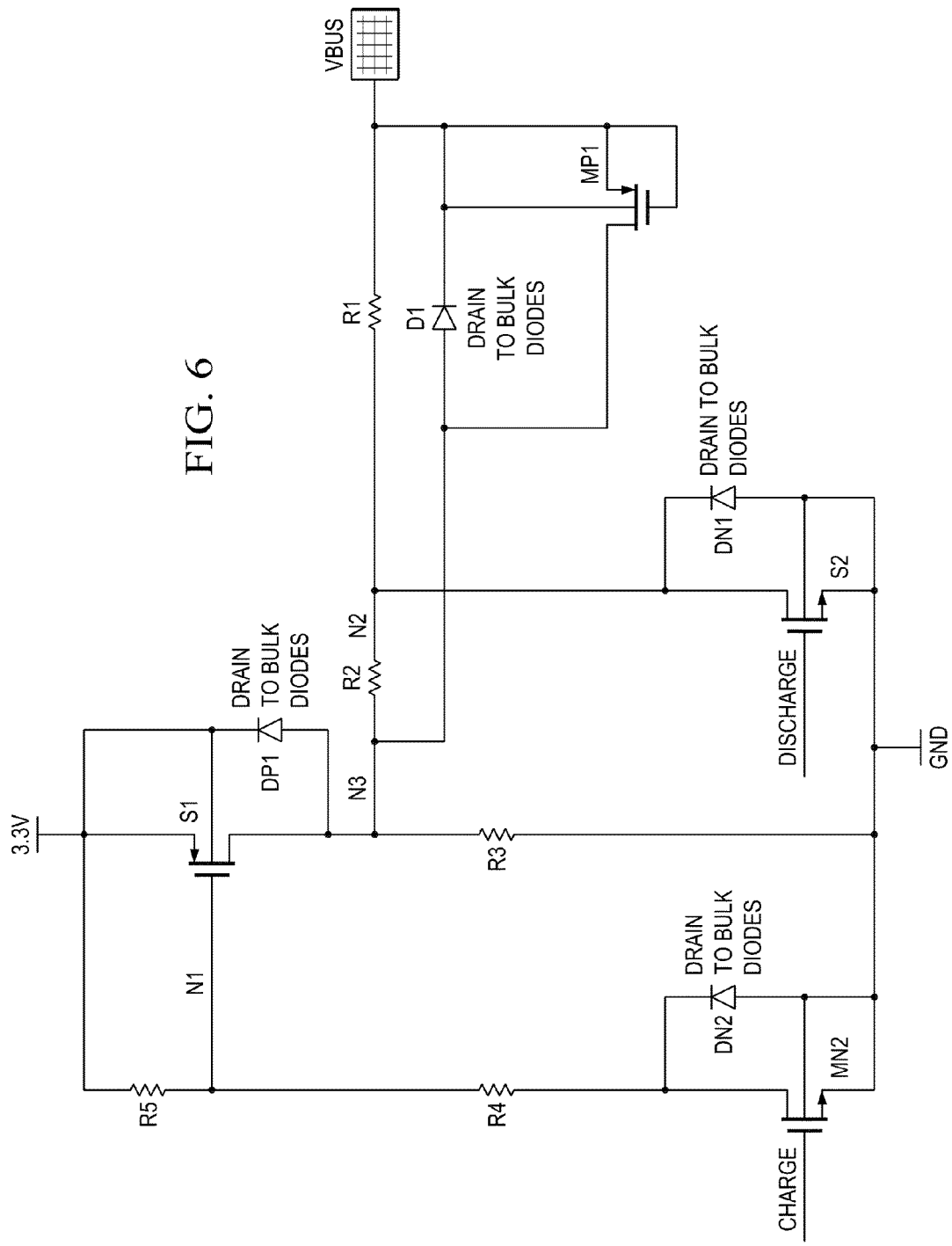
FIG. 6 illustrates a more detailed schematic of the architecture of FIG. 5; and, FIG. 7 illustrates a detailed schematic of a second proposed architecture.

The design of FIG. 5 can be used in any UDSM process when it is required to charge a node which can rise to voltages higher than the supply voltage. The complete schematic of such architecture is shown in FIG. 6. Here, the transistor diode MP1 in parallel with its parasitic diode D1 is the diode which appears in the forward path during charging. The transistor diode MP1 will further help in improving the time constant during charging. As the transistor diode MP1 has a lesser threshold voltage than the parasitic diode D1, it is more dominant while charging. Transistor MN2, R4 and R5 are used to get the control voltage of the drain extended PMOS switch S1 while switch S2 is a drain extended NMOS transistor.

Figure 7:
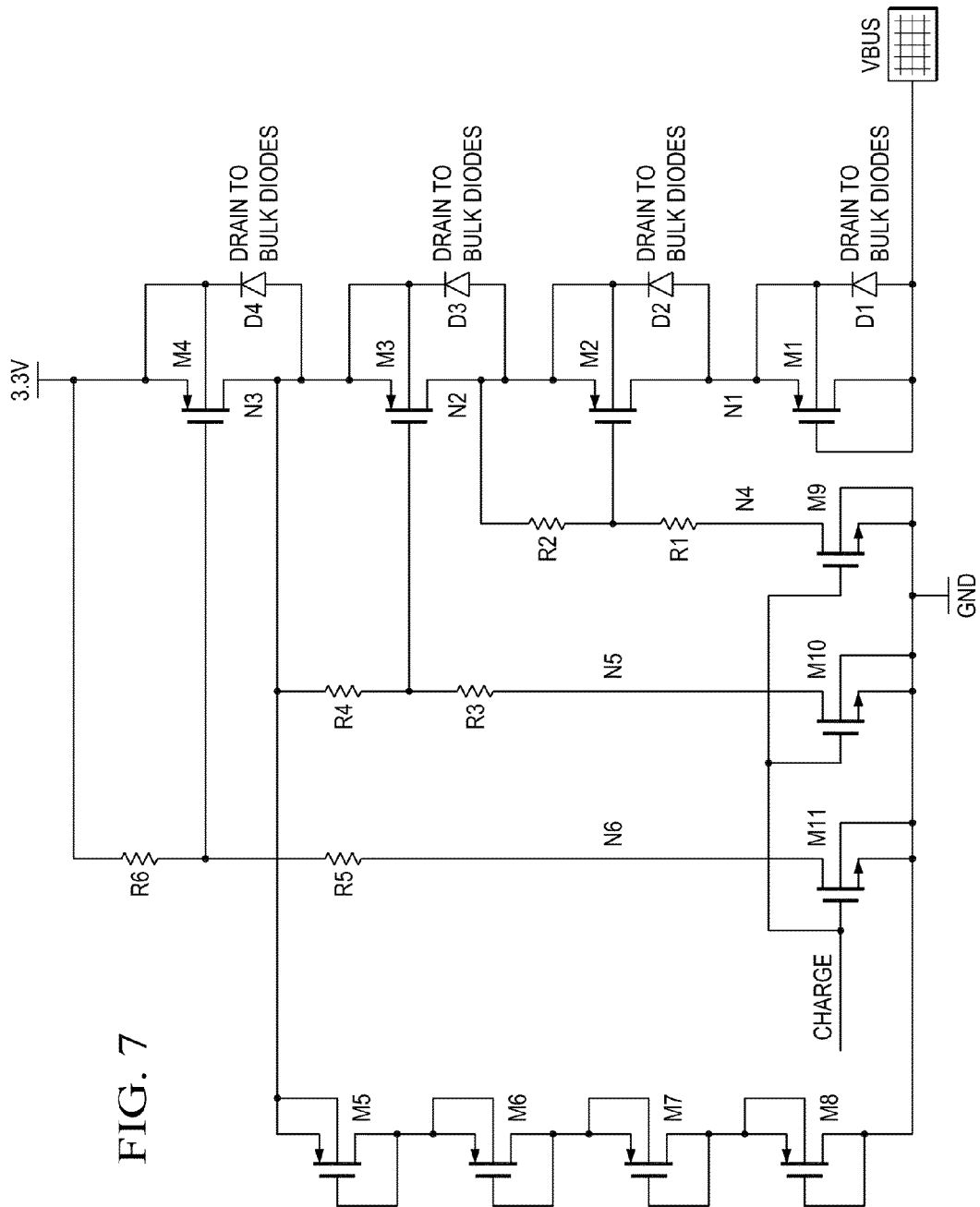

An example of the second architecture for charging VBUS is illustrated in FIG. 7 and can be derived from that shown in FIG. 4. In the first architecture (shown in FIG. 6), some current is drawn from VBUS to ensure the reliability of the transistors used in the circuit and discharge of VBUS is also possible. But as stated earlier, discharging of VBUS is not necessary as the 100 K Ohm pull down-resistor present on VBUS can discharge VBUS in the available time. A current of 100 uA may be allowed to be drawn from VBUS in certain applications. But some applications may not allow so much of current to be drawn from VBUS. A second solution as an architecture to be used in such applications is therefore proposed.

The NMOS transistor of the circuit shown in FIG. 4 can be removed to provide the second solution (to result in the exemplary architecture of FIG. 7) since there is no provision to include the discharge functionality in the architecture of the second solution. But the P terminal of the diode D6 (refer to FIG. 4) will still not be defined when VBUS is at 5.25V. The architecture shown in FIG. 7 circumvents this problem.

As illustrated in FIG. 7 for example, the PMOS transistor diode M1 is equivalent to the diode D6 of FIG. 4 while transistors M2, M3 and M4 are switches which are 'on' during charging. Hence the equivalent circuit during charging is just like that of the previous scheme during charging. When VBUS is at 5.25V, D1, D2 and M2 in parallel, D3 and M3 in parallel, M5, M6, M7 and M8 form a diode-divider from VBUS where D1, D2 and D3 are the parasitic diodes of transistors M1, M2 and M3 respectively. To ensure the reliability of transistor M9, the diode-divider has to be designed in such a manner that node N4 or N2 (N2 and N4 will be at the same potential as M9 would be OFF) does not rise above 3.6V when VBUS is at 5.25V. Also, it must be ensured that node N3 does not rise above 3V when VBUS is at 5.25V. This will ensure that the supply does not get charged up when VBUS is at 5.25V. The sizes chosen for the diode-divider will determine the current drawn from VBUS when it is at 5.25V. The parasitic diode D1 has relatively higher threshold voltage compared to that of the MOSFETs and hence, for the same current, the drop provided by the D1 is more. Therefore it is possible to keep the W/L ratios of M5, M6, M7 and M8 small in order to reduce the current drawn from VBUS when it is at 5.25V and still meet the requirement of restricting the node voltages of N2 and N3 to be less than 3.6V and 3V respectively.

In the architecture illustrated in FIG. 7, it is also possible to stack more switches like that formed by M9, R1, R2 and M2 to further restrict the current drawn from VBUS. During charging, this combination forms a switch and when VBUS is at 5.25V, this combination forms a diode string which will help restrict current drawn from VBUS. The voltage to which VBUS is charged is given by:

Voltage to which VBUS is charged in the first architecture=3V−Transistor diode drop OR the parasitic diode drop.

Voltage to which VBUS is charged in the second architecture=3V−Transistor drop.

The following features of the presently proposed architectures are noted:
These architectures can be used in any UDSM process where transistors which support a VGS of 1.8V, VGD and VDS of 3.6V are available.
The proposed architectures are generic circuits which can be used to charge a node whose potential could rise above the supply voltage. Discharge operation is possible in one of these architectures which assumes some current can be drawn from VBUS.

Advantages of the present solution include:
A novel Charge Discharge VBUS block has been proposed. This architecture is a generic architecture which can be used in any UDSM process whenever a node is to be charged, whose potential can be higher than the maximum supply available, with no reliability issues with any of the transistors.
The maximum charging time is limited only by the forward resistance of a MOS diode.
Discharge is possible in one of the proposed schemes. The static current allowed to be drawn from VBUS when it is at 5.25V decides the discharge time. More the static current allowed to be drawn from VBUS, the less will be the discharge time.

In the second architecture as illustrated in FIG. 7 for example, it is possible to restrict the current drawn from VBUS to very low values (of the order of few micro amperes) by stacking a greater number of switches.

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., where used are merely labels, and are not intended to impose numerical requirements on their objects.

What is claimed is:

1. An apparatus, comprising:
    one and only one diode coupling a forward path of a charging transistor to a discharging transistor in a switching circuit, wherein said diode, charging transistor and discharging transistor enable voltage pulsing on a bus, wherein said bus pulsing is enabled by driving the bus to an intermediate voltage for a session request protocol in a USB (Universal Serial Bus)-OTG (On The Go) application.

2. The apparatus of claim 1, wherein said diode comprises a PN diode selected to have a desired on-resistance.

3. The apparatus of claim 1, wherein said charging and discharging transistors comprise MOS transistors.

4. The apparatus of claim 3, wherein said charging transistor comprises a PMOS transistor and said discharging transistor comprises a NMOS transistor.

5. The apparatus of claim 3, wherein a first drain diode is connected between source and drain terminals of said charging transistor, and a second drain diode is connected between source and drain terminals of said discharging transistor.

6. The apparatus of claim 5, wherein one terminal of said first drain diode is connected to a drain of the charging transistor, and one terminal of the second drain diode is connected to a drain terminal of the discharging transistor.

7. The apparatus of claim 1, wherein said bus is configured to be connected through one switch to a 3.3V supply through a resistor for charging, and another switch from the bus to ground through a resistor for discharging.

8. The apparatus of claim 1, wherein said charging and discharging transistors have a voltage drain-to-source (VDS) and voltage gate-to-drain (VGD) of about 3.6V.

9. The apparatus of claim 1, including a three resistance string of a total resistance value approximating 100K Ohms connected between said bus and ground, wherein said discharge transistor comprises a drain extended NMOS transistor.

10. The apparatus of claim 1, wherein said diode and charging and discharging transistors are implemented using an ultra-deep sub-micron (UDSM) process.

11. The apparatus of claim 10, wherein the charging and discharging transistors have a maximum voltage drain-to-source (VDS) and voltage gate-to-drain (VGD) of 3.6V.

12. The apparatus of claim 1, wherein said charging and discharging transistors each comprise a MOS switch.

13. The apparatus of claim 1, wherein said charging and discharging transistors are thin gate oxide transistors.

14. A method, comprising the steps of:
    providing a charging transistor and a discharging transistor in a switching circuit in which one and only one diode couples a forward path of said charging transistor to said discharging transistor, wherein said diode, charging transistor and discharging transistor enable voltage pulsing on a bus, wherein said bus pulsing is enabled by driving the bus to an intermediate voltage for a session request protocol in a USB (Universal Serial Bus)-OTG (On The Go) application.

* * * * *